United States Patent
Shirron et al.

(10) Patent No.: US 8,357,211 B2
(45) Date of Patent: Jan. 22, 2013

(54) ADR SALT PILL DESIGN AND CRYSTAL GROWTH PROCESS FOR HYDRATED MAGNETIC SALTS

(75) Inventors: Peter J. Shirron, Silver Spring, MD (US); Michael J. DiPirro, Silver Spring, MD (US); Edgar R. Canavan, Columbia, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 319 days.

(21) Appl. No.: 12/872,445

(22) Filed: Aug. 31, 2010

(65) Prior Publication Data

US 2012/0049103 A1    Mar. 1, 2012

(51) Int. Cl.
*C01D 1/30*    (2006.01)

(52) U.S. Cl. .................................. 23/303; 23/295 R
(58) Field of Classification Search ................ 23/303, 23/295 R, 206, 300, 301, 302 R, 306
See application file for complete search history.

(56) References Cited

U.S. PATENT DOCUMENTS

| | | | | |
|---|---|---|---|---|
| 3,086,850 A | * | 4/1963 | Marino et al. | 117/204 |
| 5,082,582 A | * | 1/1992 | Ames et al. | 252/70 |

* cited by examiner

*Primary Examiner* — Edward Johnson

(57) ABSTRACT

A process is provided for producing a salt pill for use in very low temperature adiabatic demagnetization refrigerators (ADRs). The method can include providing a thermal bus in a housing. The thermal bus can include an array of thermally conductive metal conductors. A hydrated salt can be grown on the array of thermally conductive metal conductors. Thermal conductance can be provided to the hydrated salt.

11 Claims, 2 Drawing Sheets

ADR SALT PILL DESIGN AND CRYSTAL GROWTH PROCESS FOR HYDRATED MAGNETIC SALTS

STATEMENT OF GOVERNMENT INTEREST

The invention described herein was at least in-part made by an employee of the United States Government and may be manufactured and used by or for the Government of the United States of America for governmental purposes without the payment of any royalties thereon or therefor.

FIELD

The present invention relates generally to the field of adiabatic demagnetization refrigerators (ADR), and particularly, a design encapsulating and growing hydrated paramagnetic salts for use in adiabatic demagnetization refrigerators.

BACKGROUND

High-resolution detectors used in space astronomy and in some laboratory and industrial applications must be cooled to extremely low temperatures (<0.1 K) in order to obtain the required sensitivity. For space applications, adiabatic demagnetization refrigerators (ADRs) have an inherent advantage over other techniques because they don't rely on gravity to function, and because they have higher thermodynamic efficiency. An ADR stage produces cooling (or heating) by the interaction of a magnetic field with the magnetic spins in a paramagnetic salt. Magnetizing the salt produces heating, and demagnetizing the salt produces cooling.

A conventional "single-shot" ADR consists of a "salt pill" containing the magnetic salt, a superconducting magnet, and a heat switch. The salt pill is located in the bore of the magnet, and the heat switch links it to a heat sink. Regardless of the initial conditions, the refrigeration cycle consists of the following steps. First, the salt pill is magnetized, causing it to warm up. Second, when its temperature exceeds that of the heat sink, the heat switch is powered into the on state. Third, the salt continues to be magnetized, generating heat which flows to the sink. This continues until full field is reached, which necessarily is strong enough to significantly align the spins and suppress the entropy of the salt. Fourth, at full magnetic field, the heat switch is deactivated to thermally isolate the salt from the heat sink. Fifth, the salt is demagnetized to cool it to the desired operating temperature. In general, the salt will then be receiving heat from components parts. The heat is absorbed and operating temperature maintained by slowly demagnetizing the salt at just the right rate. Heat can continue to be absorbed until the magnetic field is reduced to zero, at which point the ADR has run out of cooling capacity.

Conventional single-shot ADRs provide cooling for a period of time, then they must be taken off line and recycled. The periodic interruption in cooling leads to a number of significant constraints on the design of ADRs for space missions. The two most important are that the hold time must be long, typically on the order of one day, and the time spent recycling the ADR must be short, typically one hour or less.

A need exists for an ADR salt pill design and a method for making the same that overcome these constraints.

SUMMARY

According to various embodiments of the present teachings, a new process for growing hydrated magnetic salts, or producing a salt pill, is provided. According to various embodiments, the method of producing a salt pill can comprise providing a thermal bus in a housing. The thermal bus can comprise an array of thermally conductive metal conductors. In some embodiments, the housing can be sealed. According to some embodiments, thermal conductance can be provided to the hydrated salt. The hydrated salt can be grown on the array of thermal conductivity metal conductors by flowing saturated solution into the housing and drawing depleted solution away from the housing. In some embodiments, crystallites can be nucleated first at the bottom of the housing. Controlled growth of crystallites can be established from the bottom of the housing upwards.

According to some embodiments, saturated solution can be flowed into the housing and depleted solution can be drawn away from the housing simultaneously. In some embodiments, each thermally conductive metal conductor of the array of thermally conductive metal conductors can have a spacing of from about 0.02 to about 0.20 cm, for example, and a diameter of about 0.04 cm to about 0.08 cm.

According to some embodiments, each thermally conductive metal conductor of the array of thermally conductive metal conductors can have a length of from about 2.0 cm to about 8.0 cm, or from about 3.5 cm to about 5.5 cm.

According to some embodiments, the thermally conductive metal conductors of the array can be bundled parallel to one another. Each thermally conductive metal conductor of the array of thermally conductive metal conductors can be spaced from one or more adjacent thermally conductive metal conductors of the array by a spacing of about 5.0 cm or less, for example, by 4.0 cm or less, by 2.0 cm or less, or by 1.0 cm or less.

According to some embodiments, the saturated solution can comprise an aqueous saturated solution of an appropriate ADR salt.

In some embodiments, a design for a multi-stage, continuous ADR can be employed, as described in "A Multi-Stage Continuous-Duty Adiabatic Demagnetization Refrigerator," Shirron et al., Cryogenic Engineering Conference, Montreal, Canada, Jul. 13-16, 1999, which is incorporated by reference in its entirety herein. The multi-stage continuous ADR can use a high heat capacity reservoir (a paramagnetic salt) connected to a single-stage ADR through a superconducting heat switch. The reservoir can reduce temperature excursions as the ADR is recycled.

BRIEF DESCRIPTION OF THE DRAWINGS

The present teachings will be described with reference to the accompanying drawings. The drawings are intended to illustrate, not limit, the present teachings.

DETAILED DESCRIPTION OF THE PRESENT INVENTION

According to various embodiments, a new process for producing a salt pill is provided for use in very low temperature adiabatic demagnetization refrigerators (ADRs). According to various embodiments, the method of producing a salt pill can comprise providing a thermal bus in a housing. The thermal bus can comprise an array of thermally conductive metal conductors. A hydrated salt can be grown on the array of thermally conductive metal conductors. The housing comprising the array of thermally conductive metal conductors can be sealed. In some embodiments, thermal conductance can be provided to the hydrated salt during the formation thereof.

According to some embodiments, the hydrated salt can be grown on the array of thermally conductive metal conductors by exposing the thermal bus to a saturated solution. This process can comprise a continuous counter flow technique where saturated solution flows into the salt pill and depleted solution is withdrawn from the salt pill. The salt pill can be grown using a small peristaltic circulating pump with two pumping lines. One pumping line can deliver saturated solution at room temperature from a remote reservoir into the salt container and the other pumping line can withdraw depleted solution and return it to the reservoir. The return line's inlet can be initially positioned close to the bottom of the salt container. According to some embodiments, the return line can comprise larger tubing than the supply line to achieve a four times higher flow rate. According to some embodiments, the solution can be maintained at a level just below the return line's inlet. According to some embodiments, the return line can be raised as the salt grows, thereby producing salt pill with no voids or pockets of spent solution.

According to some embodiments, the high thermal conductivity metal conductors can be made from copper. The thermal bus can be sealed in a housing. The housing can be hermetically sealed. The housing can comprise stainless steel, or can comprise any other suitable metal.

According to various embodiments, automated machining processes can be employed to implement the process for producing a salt pill. According to some embodiments, an array of conductors can be generated that is connected to an external bolting surface. The size and spacing of the array of thermal conductors can provide very high thermal conductance to the salt while minimizing complications due to surface tension.

Figure 1:
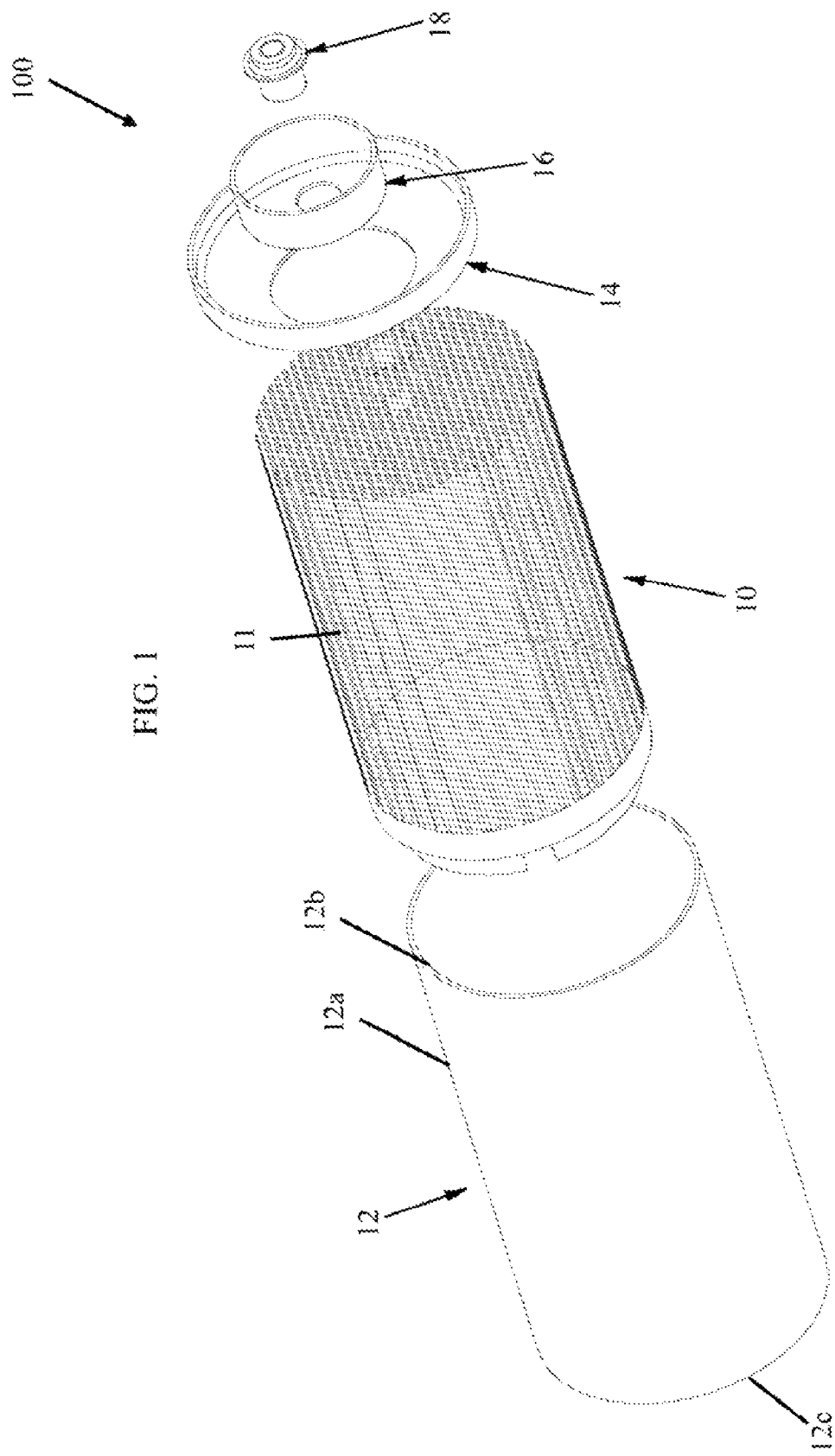
FIG. 1 shows an exploded view of a device to form a salt pill according to various embodiments of the present teachings.

According to various embodiments and with reference to FIG. 1, a method of producing a salt pill can comprise positioning a thermal bus 10 in a housing 12. According to some embodiments, the housing 12 can comprise a cylindrical case 12a having a closed bottom end 12b and an open top end 12c. As shown, the housing can comprise an end cap 14 for closing open top end 12c of cylindrical case 12a. According to some embodiments, thermal bus 10 can be formed by cutting a single piece of metal into an array of thermally conductive metal conductors 11. Thermal bus 10 can be cut using a wire EDM (electric discharge machine) technique. Each thermally conductive metal conductor of the array of thermally conductive metal conductors can have a diameter of about 0.04 cm to about 0.08 cm, for example, of 0.04 cm, 0.05 cm, 0.06 cm, 0.07 cm, or 0.08 cm. The diameter of each conductor in the array of thermally conductive metal conductors 11 can be equal to, less than, or greater than, the spacing between each conductor. In some embodiments, the diameter of each conductor in the array of thermal conductivity metal conductors 11 can be equal to the spacing between the conductors. According to some embodiments, each thermal conductivity metal conductor of the array of thermal conductivity metal conductors can have a length of about 2.0 cm to about 8.0 cm, or from about 3.5 cm to about 5.5 cm. According to some embodiments, housing 12 can be sized and dimensioned to completely encompass thermal bus 10.

According to various embodiments, the salt pill can be from about 4 cm to about 7 cm in length. The salt pill can be about 5.0 cm, 5.2 cm, 5.4 cm, 5.6 cm, 5.8 cm, or 6.0 cm, in length. According to some embodiments, the salt pill can have a diameter of from about 1 cm to about 4 cm. In some embodiments, the salt pill can have a diameter of about 1.1 cm, 1.3 cm, 1.5 cm, 1.7 cm, or 1.9 cm. In some embodiments, a fill tube 16 adjacent end cap 14 can be used to provide access for the flow of solution. Fill tube 16 can be sealed after crystal is formed in housing 12. End cap 14 can be welded to open top end 12c of cylindrical case 12a. According to some embodiments, cylindrical case 12a can be hermetically sealed.

According to various embodiments, end cap 14 can be provided with a thermometer mount 18. Thermometer mount 18 can be used to mount a thermometer. Thermometer mount 18 can be made from copper, or other suitable metal. Thermometer mount 18 can be in intimate thermal contact with crystals formed in housing 12.

According to various embodiments, the method can comprise growing a hydrated salt on the array of thermally conductive metal conductors 11. A saturated solution can be flowed into the housing and a depleted solution can be drawn away from the housing. In some embodiments, saturated solution can be flowed into the housing and depleted solution can be drawn away from the housing simultaneously.

According to some embodiments, the saturated solution can comprise hydrated salt and water. According to some embodiments, the hydrated salt can comprise any suitable hydrated salt, such as, for example, chromium potassium alum, chromic cerium alum (CCA), or combinations thereof and the like. In some embodiments, crystallites can be nucleated first at the bottom of housing 12. Controlled growth of crystallites can be established from the bottom of housing 12 upwardly. Thermal conductance can be provided to the hydrated salt in housing 12.

In various embodiments, the array of thermally conductive metal conductors can be connected to an external bolting surface. In some embodiments, the array of thermal conductivity metal conductors can be integrally connected to an external bolting surface.

According to various embodiments, fill fraction of from about 95% to about 100% can be achieved.

Figure 2:
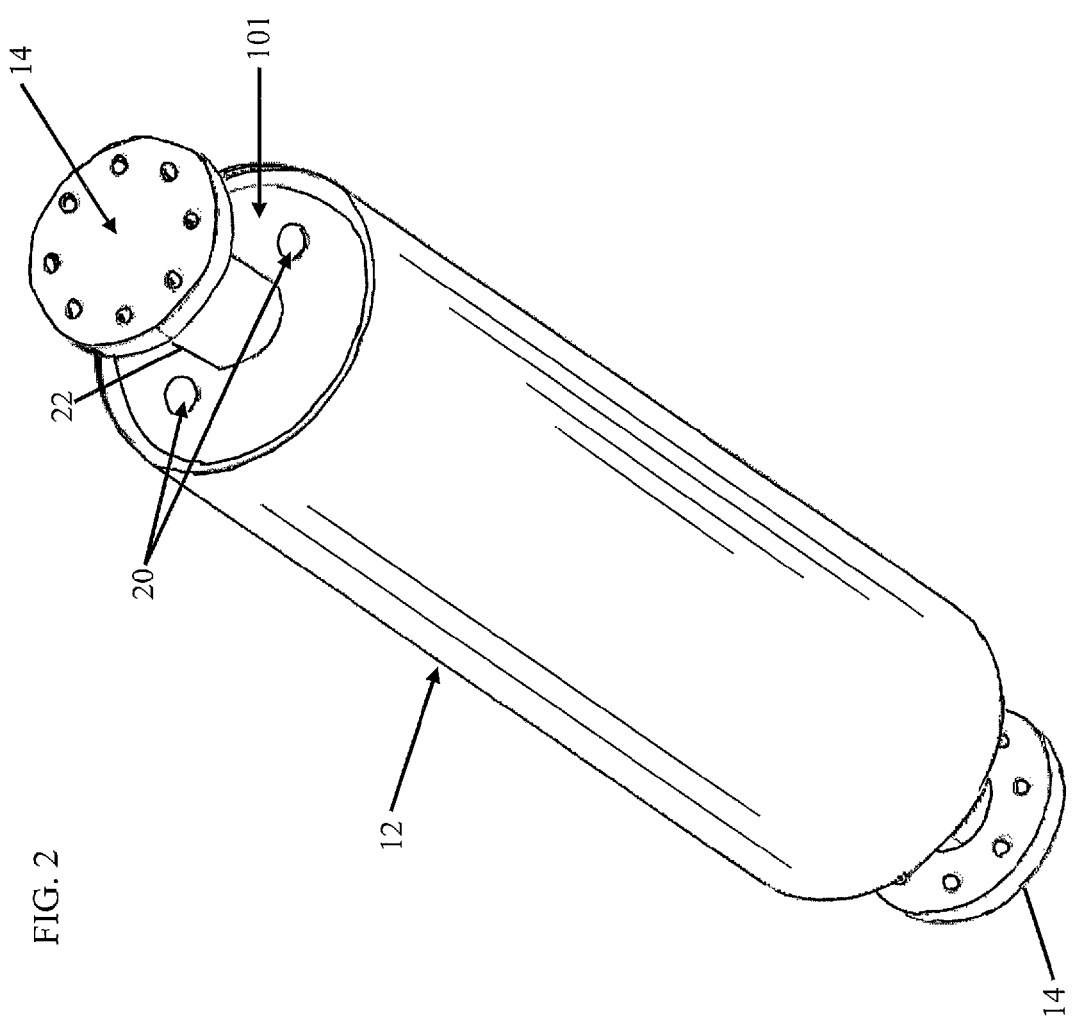
FIG. 2 shows a perspective top view of a device to form a salt pill according to various embodiments of the present teachings.

FIG. 2 depicts an alternative embodiment of salt pill growing device 101. Salt pill growing device 101 is identical to salt pill growing device 100 from FIG. 1 except that salt pill growing device 101 comprises an attachment means 20 on end cap 14 and at least two fill ports 22 for salt growth.

Other embodiments of the present invention will be apparent to those skilled in the art from consideration of the present specification and practice of the present invention disclosed herein. It is intended that the present specification and examples be considered as exemplary only with the true scope and spirit of the invention being indicated by the following claims and equivalents thereof.

What is claimed is:

1. A method of producing a salt pill comprising:
   providing a thermal bus in a housing, the thermal bus comprising an array of thermally conductive metal conductors;
   sealing the housing comprising the array of thermally conductive metal conductors;
   providing thermal conductance to the array of thermally conductive metal conductors; and
   growing a hydrated salt on the array of thermally conductive metal conductors by flowing saturated solution into the housing and drawing depleted solution away from the housing, whereby crystallites are nucleated first at the bottom of the housing and controlled growth of crystallites is established from the bottom of the housing in an upward direction.

2. The method of claim 1, wherein the sealing comprises hermetically sealing the housing.

3. The method of claim 1, wherein the flowing saturated solution into the housing is conducted simultaneously with the drawing depleted solution away from the housing.

4. The method of claim 1, wherein each thermally conductive metal conductor of the array of thermally conductive metal conductors has a diameter of from about 0.04 cm to about 0.08 cm.

5. The method of claim 1, wherein each thermally conductive metal conductor of the array of thermally conductive metal conductors has a length of from about 3.5 cm to about 5.5 cm.

6. The method of claim 1, wherein the thermally conductive metal conductors of the array of thermally conductive metal conductors are spaced apart from each other.

7. The method of claim 1, wherein the saturated solution comprises chromium potassium alum, chromic cerium alum, or a combination thereof.

8. The method of claim 1 further comprises connecting the array of thermally conductive metal conductors to an external bolting surface.

9. The method of claim 1, wherein the array of thermally conductive metal conductors is integrally connected to an external bolting surface.

10. The method of claim 1, wherein the fill fraction achieved comprises from about 95% to about 100%.

11. The method of claim 1, wherein the housing comprises stainless steel.

* * * * *